Jan. 5, 1960 A. J. W. M. VAN OVERBEEK 2,920,277
TRANSISTOR AMPLIFIER
Filed Jan. 24, 1955
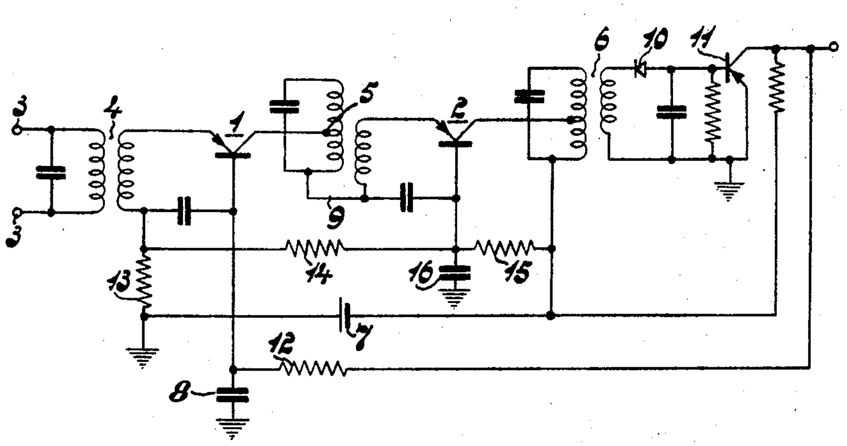
INVENTOR
ADRIANUS JOHANNES WILHELMUS
MARIE VAN OVERBEEK
BY Fred M. Vogel
AGENT

United States Patent Office 2,920,277

Patented Jan. 5, 1960

2,920,277

TRANSISTOR AMPLIFIER

Adrianus Johannes Wilhelmus Marie Van Overbeek, Emmasingel, Eindhoven, Netherlands, assignor, by mesne assignments, to North American Philips Company, Inc., New York, N.Y., a corporation of Delaware Application January 24, 1955, Serial No. 483,623

Claims priority, application Netherlands January 28, 1954

1 Claim. (Cl. 330—19)

The present invention relates to transistor amplifiers. More particularly, the invention relates to a circuit arrangement for amplifying a signal oscillation with the aid of a plurality of transistors connected in cascade for the signal oscillation. The present invention concerns the provision of an amplifier arrangement in which the amplification factor may be controlled in an efficient manner.

An amplifying arrangement is known in which the emitter-collector electrode paths of the transistors are connected in series for the direct supply current. In accordance with the present invention, in such a known arrangement, a control voltage is supplied to the base electrode of one of the transistors of the cascade connection. The control-voltage controls the direct current from the emitter electrode to the collector electrode and at the same time the amplification of each of the transistors.

The invention will be described with reference to the drawings, in which the figure is a schematic diagram of an embodiment of the circuit arrangement of the present invention.

The amplifier comprises two transistors 1 and 2, with the aid of which a signal oscillation at the input terminals 3 is amplified through selective coupling networks 4, 5 and 6 in cascade connection. A supply source 7 furnishes direct supply current which traverses in series the emitter-collector electrode paths of the transistors 1 and 2. This is due to the provision of direct-current connection 9 between the collector electrode of the transistor 1 and the emitter electrode of the transistor 2; no other direct current path is provided between these electrodes and the supply source 7.

A control-voltage for controlling the amplification may for example be produced with the aid of a detector 10 followed by an amplifier 11 and a smoothing filter 8, 12, while the potentiometer 13, 14, 15 with the smoothing capacitor 16 serves to obtain the desired electrode bias voltages. This control-voltage is now supplied to the base electrode of the transistor 1, this voltage thus controlling the direct current from the emitter electrode to the collecor electrode of the transistor 1. This direct current in turn determines the signal amplification of the first transistor, in view of the fact that the input impedance of said first transistor increases as its emitter current decreases, or that, at the same time, the current amplification factor of the said transistor varies. However, since this direct current also traverses the transistor 2, the amplification of the transistor 2 is simultaneously controlled in a similar manner, so that an effective amplification control is obtained.

It is obvious that in this manner the amplification of a plurality of cascade-connected transistors can be controlled in accordance with a control-voltage which, if desired, may be furnished by a source completely independent of the signal strength.

It is to be understood that the invention is not limited to the details disclosed but includes all such variations and modifications as fall within the spirit of the invention and the scope of the appended claim.

What is claimed is:

An amplifying circuit comprising first, second and third transistors, each of said transistors having an emitter, a collector and a base electrode, means for applying a signal to the emitter of said first transistor, said means comprising a first transformer having primary and secondary windings, a first capacitor connected across said primary winding, a second capacitor connected at one end to the base electrode of said first transistor and at the other end to one end of said secondary winding, the other end of said secondary winding being connected to the emitter of said first transistor, second and third transformers each having a secondary winding and a primary winding having a tap thereon, the tap on the primary winding of said second transformer being connected to the collector of said first transistor, a third capacitor connected across the primary winding of said second transformer, a fourth capacitor connected between the base electrode of said second transistor and one end of the secondary winding of said second transformer, the other end of the secondary winding of said second transformer being connected to the emitter of said second transistor, the one end of the secondary winding of said second transformer being connected also to the one end of the primary winding of said second transformer, the tap on the primary of said third transformer being connected to the collector of said second transistor, a fifth capacitor connected across the primary winding of said third transformer, means for applying a bias voltage to the electrodes of said first and second transistors, said bias voltage means including a source of direct current, one terminal of said source being connected to ground, the other terminal of said source being connected to the primary winding of said third transformer, a series combination of first, second and third resistors connected across said source and a first smoothing capacitor connected between the junction point of said second and third resistors and ground, said junction point being connected to the base electrode of said second transistor, the junction point between said first and second resistors being connected to the one end of the secondary winding of said first transformer, means for producing a control voltage, said control voltage producing means comprising a sixth capacitor connected across the secondary winding of said third transformer, a rectifier interposed between said sixth capacitor and the secondary winding of said third transformer, a fourth resistor connected across said sixth capacitor, the base electrode of said third transistor being connected to one end of said fourth resistor and the emitter electrode of said third transistor being connected to the other end of said fourth resistor and to ground and a fifth resistor connected between the collector of said third transistor and the other terminal of said source of direct current, and means for applying said control voltage to the base electrode of said first transistor to control the flow of direct current from the emitter to the collector of said first transistor, said applying means comprising a sixth resistor connected between the collector of said third transistor and the base electrode of said first transistor and a second smoothing capacitor connected between the base electrode of said first transistor and ground and thereby controlling the amplification factor of said first and second transistors.

References Cited in the file of this patent

UNITED STATES PATENTS

| | | |
|---|---|---|
| 1,869,331 | Ballantine | July 26, 1932 |
| 2,544,211 | Barton | Mar. 6, 1951 |
| 2,666,817 | Raisbeck et al. | Jan. 19, 1954 |
| 2,676,214 | Van Weel | Apr. 20, 1954 |
| 2,751,446 | Bopp | June 19, 1956 |
| 2,774,826 | Moulon | Dec. 18, 1956 |

OTHER REFERENCES

Shea text: "Principles of Transistor Circuits," Sept. 15, 1953, pages 109–124, and 351.